United States Patent
Yamamoto

(10) Patent No.: US 7,902,856 B2
(45) Date of Patent: Mar. 8, 2011

(54) SEMICONDUCTOR INTEGRATED CIRCUIT

(75) Inventor: Mitsuhiro Yamamoto, Kanagawa (JP)

(73) Assignee: RENESAS Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/656,667

(22) Filed: Feb. 12, 2010

(65) Prior Publication Data

US 2010/0207662 A1   Aug. 19, 2010

(30) Foreign Application Priority Data

Feb. 16, 2009   (JP) .................................. 2009-032898

(51) Int. Cl.
*H03K 19/003* (2006.01)
*G01R 31/28* (2006.01)

(52) U.S. Cl. ............... 326/12; 326/16; 326/96; 714/724; 714/726; 714/734

(58) Field of Classification Search .................... 326/12, 326/16, 93–96; 327/200–218; 324/765; 713/401; 714/724, 726, 727, 734, 742
See application file for complete search history.

(56) References Cited

U.S. PATENT DOCUMENTS

| | | | | |
|---|---|---|---|---|
| 4,975,640 A | * | 12/1990 | Lipp | 714/734 |
| 5,281,864 A | * | 1/1994 | Hahn et al. | 327/202 |
| 5,504,756 A | * | 4/1996 | Kim et al. | 714/729 |
| 6,691,268 B1 | * | 2/2004 | Chin | 714/726 |

FOREIGN PATENT DOCUMENTS

JP   56-168268   12/1981

* cited by examiner

*Primary Examiner* — Vibol Tan
(74) *Attorney, Agent, or Firm* — McGinn IP Law Group, PLLC

(57) ABSTRACT

An exemplary aspect of the invention is to conduct delay tests under actual operating conditions for a semiconductor integrated circuit including multiple logic circuits operating based on clocks of different frequencies, without causing any inconveniences when a test clock is set to a high-frequency side or a low-frequency side. The semiconductor integrated circuit includes: a first logic block that operates based on a first clock; a second logic block that operates based on a second clock having a frequency different from that of the first clock; and a test circuit connected between the first logic block and the second logic block. The test circuit outputs an output of the first logic block set as a test target, without passing through the second logic block, and transmits an input value received without being passed through the first logic circuit, to the second logic circuit set as a test target.

14 Claims, 11 Drawing Sheets

| CONTROL SIGNAL (CS) | | | |
|---|---|---|---|
| CS=00 | CS=01 | CS=10 | CS=11 |
| NORMAL OPERATION | | SCAN TARGET=CIRCUIT BLOCK 10 | SCAN TARGET=CIRCUIT BLOCK 20 |

Fig. 2

| SCAN TARGET | CONTROL SIGNAL CS=10 | CONTROL SIGNAL CS=11 |
|---|---|---|
| | CIRCUIT BLOCK 10 | CIRCUIT BLOCK 20 |
| OPERATION OF SELECTOR 12 | OUTPUT DATA RECEIVED AT INPUT "a" | — |
| OPERATION OF SELECTOR 32 | OUTPUT DATA RECEIVED AT INPUT "b" | OUTPUT DATA RECEIVED AT INPUT "a" |
| OPERATION OF SELECTOR 45 | OUTPUT CLOCK CLK1 RECEIVED AT INPUT "a" | OUTPUT CLOCK CLK2 RECEIVED AT INPUT "b" |
| CLOCK SUPPLIED TO TEST CIRCUIT 30 | CLK1 | CLK2 |
| INPUT TERMINAL FOR TEST VALUE | INPUT TERMINAL 65 | INPUT TERMINAL 67 |
| OUTPUT TERMINAL FOR TEST VALUE | OUTPUT TERMINAL 66 | OUTPUT TERMINAL 68 |

Fig. 3

SEMICONDUCTOR INTEGRATED CIRCUIT

INCORPORATION BY REFERENCE

This application is based upon and claims the benefit of priority from Japanese patent application No. 2009-032898, filed on Feb. 16, 2009, the disclosure of which is incorporated herein in its entirety by reference.

BACKGROUND

1. Field of the Invention

The present invention relates to a semiconductor integrated circuit, and more particularly, to a semiconductor integrated circuit including a test circuit.

2. Description of Related Art

With the recent remarkable development of technology for semiconductor integrated circuits, multiple circuit blocks that operate based on clocks of different frequencies may be incorporated into a single circuit chip. In such a case, both a logic test and a delay test are usually carried out to secure the reliability of the circuit chip.

Japanese Unexamined Patent Application Publication No. 56-168268 discloses a technique for diagnosing asynchronous operation by use of a scan-in/scan-out technique. Japanese Unexamined Patent Application Publication No. 56-168268 discloses the technique in which all flip-flop circuits in logic circuits to be diagnosed are configured as a series of shift registers during a test, and setting of a state (scan-in) and reading of a state (scan-out) are carried out by shift operation, thereby testing the logic circuits to be diagnosed as a combinational circuit.

SUMMARY

In general, when a delay test is conducted on a circuit chip having multiple circuit blocks incorporated therein which operate based on clocks of different frequencies, the delay test is conducted using a test clock having a specific frequency. This is because, if other types of tests are taken into consideration, the reliability of the circuit chip is sufficiently secured even when the test clock is set to a low frequency clock.

However, in the case of an in-vehicle circuit chip, for example, it is required to secure the reliability of the circuit chip at a higher level than in the conventional case. In the above-mentioned case, when the test clock is set to the high frequency side in order to enhance the reliability of the delay test, there may arise a need to design the circuit block, which operates based on the low frequency clock, so as to be able to operate based also on the high frequency clock. It is impractical in many aspects (e.g., an increase in circuit area due to an additional circuit) to design and produce the circuit block, which operates based on the low frequency clock, so as to be able to operate based also on the high frequency clock for the test.

Note that when the test clock is set to the low frequency clock, it is impossible to detect a delay which occurs during actual operation of the circuit block that operates based on the high frequency clock, and it is impossible to increase the level of the delay test in the first place.

As is obvious from the above description, there is a strong demand for conducting a delay test under actual operating conditions for a semiconductor integrated circuit including multiple logic circuits that operate based on clocks of different frequencies, without causing any inconveniences when the test clock is set to one of the high-frequency side and the low-frequency side.

A first exemplary aspect of the present invention is a semiconductor integrated circuit including: a first logic circuit that operates based on a first clock; a second logic circuit that operates based on a second clock having a frequency different from a frequency of the first clock; and a test circuit connected between the first logic circuit and the second logic circuit. The test circuit outputs an output of the first logic circuit set as a test target, without passing through the second logic circuit, and transmits an input value received without being passed through the first logic circuit, to the second logic circuit set as a test target.

In the semiconductor integrated circuit according to the first exemplary aspect of the present invention, the test circuit is first connected between the first and second logic circuits. During a delay test for the first logic circuit, the test circuit outputs the output of the first logic circuit without passing through the second logic circuit. Further, during a test for the second logic circuit, the test circuit transmits the input value received without being passed through the first logic circuit, to the second logic circuit. Furthermore, during the tests for the logic circuits, the test circuit carries out different operations between the tests. This makes it possible to conduct delay tests under actual operating conditions without causing any inconveniences when the test clock is set to one of the high-frequency side and the low-frequency side.

A second exemplary aspect of the present invention is an operation method of a semiconductor integrated circuit, the semiconductor integrated circuit including: a first logic circuit that operates based on a first clock; a second logic circuit that operates based on a second clock having a frequency different from a frequency of the first clock; and a test circuit connected between the first logic circuit and the second logic circuit, the operation method including: outputting, by the test circuit, an output of the first logic circuit set as a test target, without passing through the second logic circuit, and transmitting an input value received without being passed through the first logic circuit, to the second logic circuit set as a test target.

According to exemplary aspects of the present invention, it is possible to conduct delay tests under actual operating conditions for a semiconductor integrated circuit including multiple logic circuits that operate based on clocks of different frequencies, without causing any inconveniencies when a test clock is set to one of a high-frequency side and a low-frequency side.

BRIEF DESCRIPTION OF THE DRAWINGS

The above and other exemplary aspects, advantages and features will be more apparent from the following description of certain exemplary embodiments taken in conjunction with the accompanying drawings, in which:

FIG. 2 is an explanatory diagram illustrating control operation for the semiconductor integrated circuit based on a control signal according to the first exemplary embodiment of the present invention;

FIG. 3 is an explanatory diagram illustrating operating states and operating conditions of the semiconductor integrated circuit at the time of scanning according to the first exemplary embodiment of the present invention;

DETAILED DESCRIPTION OF THE EXEMPLARY EMBODIMENTS

Figure 1:
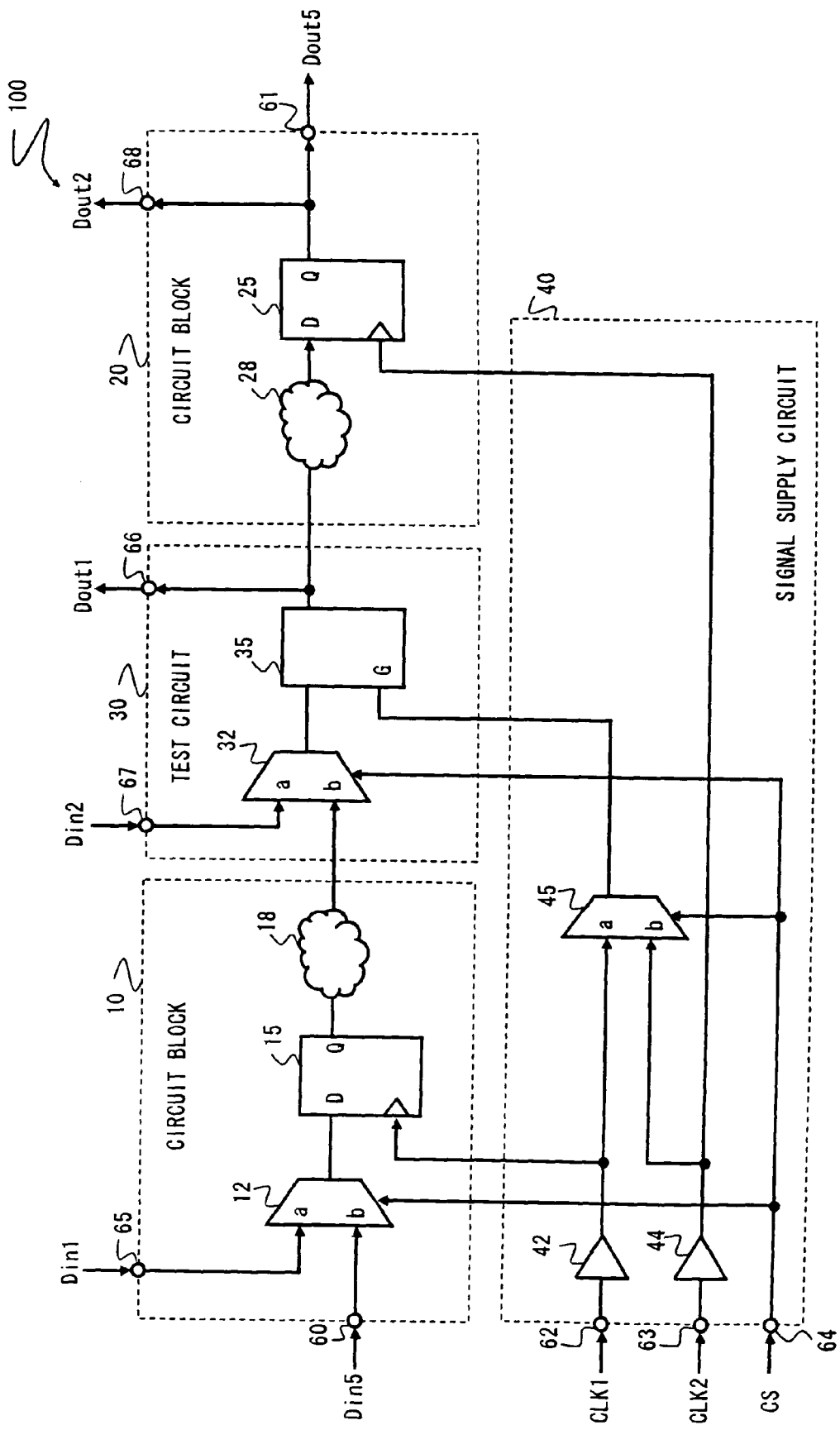
FIG. 1 is a schematic circuit diagram of a semiconductor integrated circuit according to a first exemplary embodiment of the present invention.

The first and second exemplary embodiments can be combined as desirable by one of ordinary skill in the art.

Exemplary embodiments of the present invention will be described below with reference to the accompanying drawings. Note that exemplary embodiments are simplified for purposes of illustration. The drawings are in simplified form, and the technical scope of the present invention should not be interpreted to be limited to the drawings. The drawings are shown only for the purpose of illustrating the technical concept of the present invention, and the components shown in the drawings are not to scale. The same components are denoted by the same reference numerals, and a redundant explanation thereof is omitted.

First Exemplary Embodiment

Figure 4:
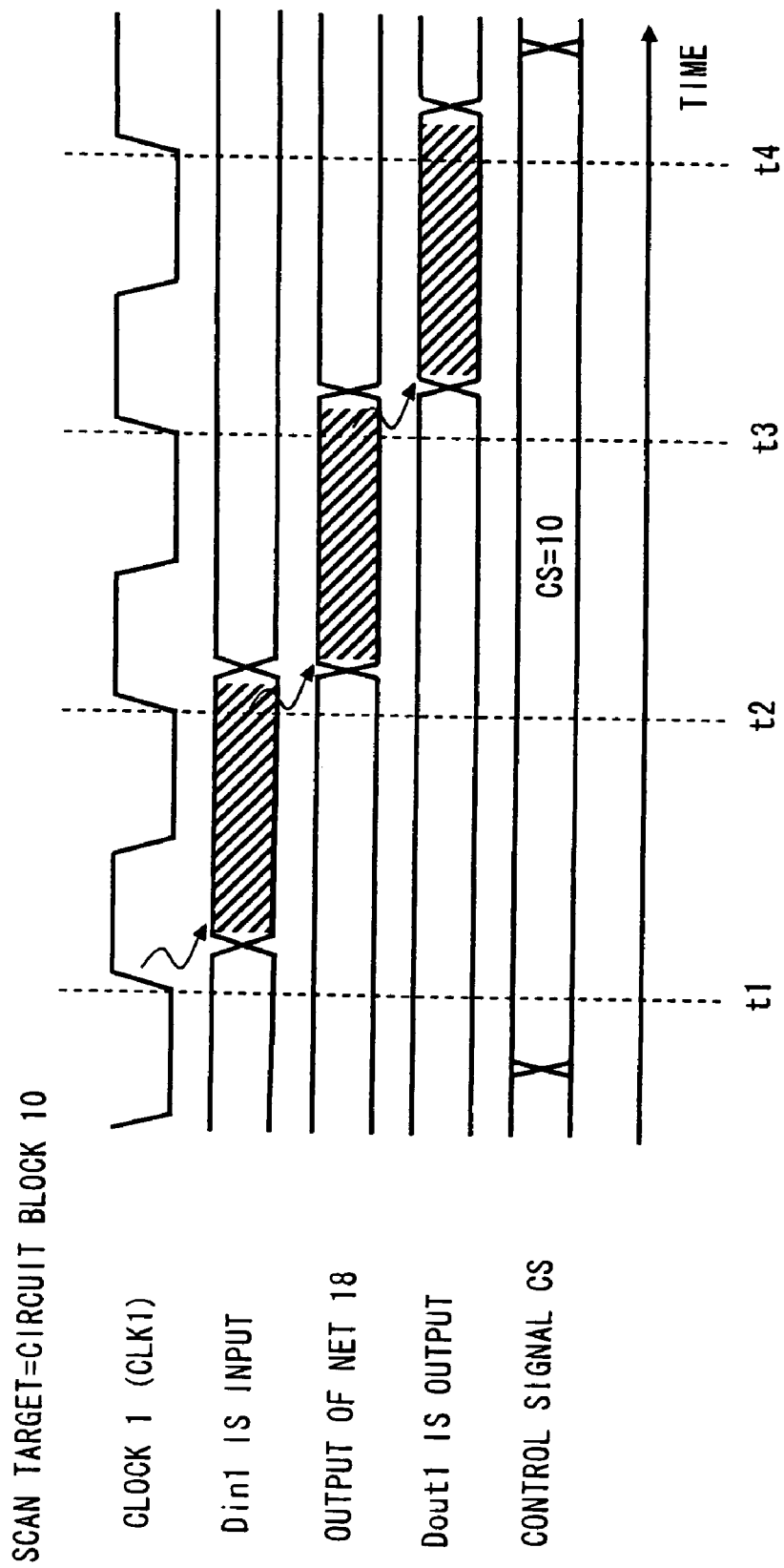
FIG. 4 is a schematic timing diagram illustrating the operation of the semiconductor integrated circuit at the time of scanning according to the first exemplary embodiment of the present invention.
Figure 5:
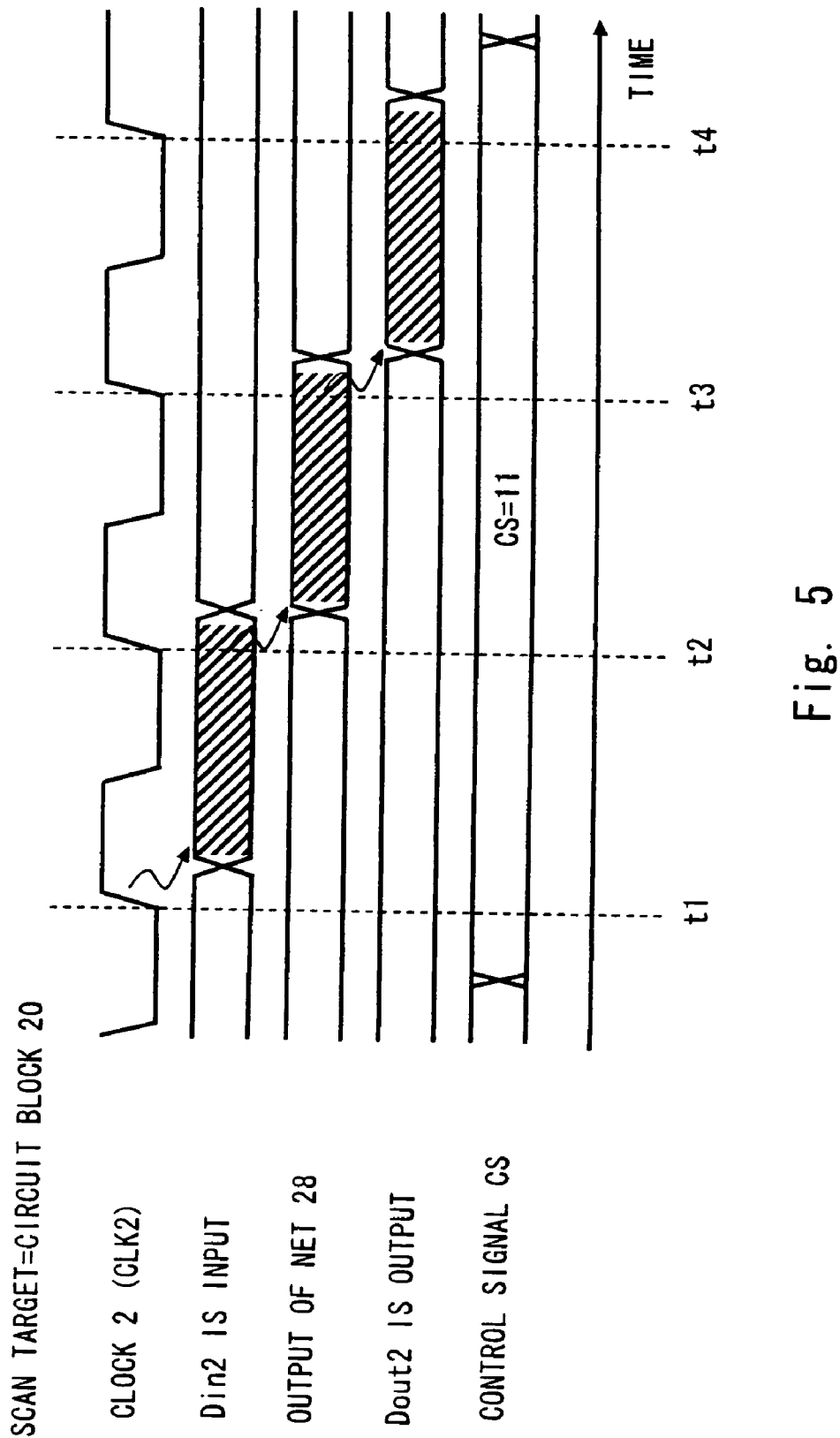
FIG. 5 is a schematic timing diagram illustrating the operation of the semiconductor integrated circuit at the time of scanning according to the first exemplary embodiment of the present invention.
Figure 6:
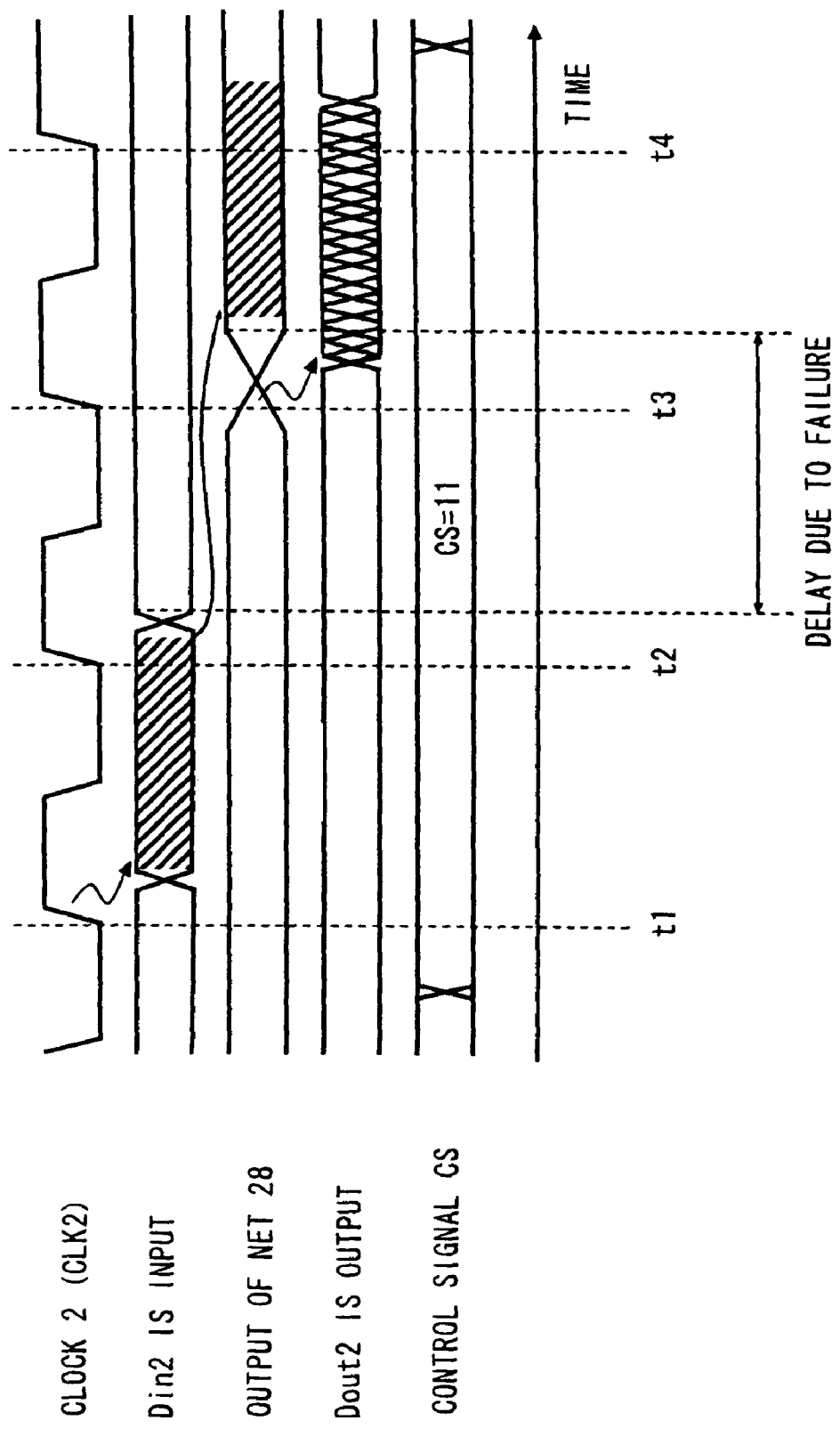
FIG. 6 is a schematic timing diagram illustrating the operation of the semiconductor integrated circuit at the time of scanning according to the first exemplary embodiment of the present invention.

A first exemplary embodiment of the present invention will be described below with reference to FIGS. 1 to 6. FIG. 1 is a schematic circuit diagram of a semiconductor integrated circuit according to the first exemplary embodiment. FIG. 2 is an exemplary diagram illustrating control operation for the semiconductor integrated circuit based on a control signal. FIG. 3 is an explanatory diagram illustrating operating states and operating conditions of the semiconductor integrated circuit at the time of scanning. FIGS. 4 to 6 are schematic timing diagrams each illustrating the operation of the semiconductor integrated circuit at the time of scanning.

As shown in FIG. 1, a semiconductor integrated circuit 100 includes a circuit block 10, a circuit block 20, a test circuit 30, and a signal supply circuit 40. The circuit block 10 includes a selector 12, a F/F 15, and a net 18. The circuit block 20 includes a net 28 and a F/F 25. The test circuit 30 includes a selector 32 and a latch 35. The signal supply circuit 40 includes a gate 42, a gate 44, and a selector 45. During a test, a tester (not shown) for conducting delay tests is connected to the semiconductor integrated circuit 100.

Note that the circuit blocks 10 and 20 can be regarded as logic circuits. The term "F/F" is short for a flip-flop circuit. Each of the F/Fs 15 and 25 serves as a holding circuit that temporarily holds a logic value synchronously with a clock. Each of the nets 18 and 28 is a combinational circuit including a combination of multiple logic elements. At the time of testing the semiconductor integrated circuit 100, the latch 35 functions as a holding circuit that holds a logical value synchronously with a rising edge of a clock.

A description is first given of the connection relationship between the circuit elements included in the semiconductor integrated circuit 100. An input terminal 65 is connected to an input "a" of the selector 12, and an input terminal 60 is connected to an input "b" of the selector 12. An output of the selector 12 is connected to a D terminal of the F/F 15. A Q terminal of the F/F 15 is connected to an input of the net 18.

An input terminal 67 is connected to an input "a" of the selector 32, and an output of the net 18 is connected to an input "b" of the selector 32. An output of the selector 32 is connected to an input of the latch 35. An output of the latch 35 is connected to an output terminal 66. The output of the latch 35 is also connected to an input of the net 28. An output of the net 28 is connected to a D terminal of the F/F 25. A Q terminal of the F/F 25 is connected to an output terminal 68. The Q terminal of the F/F 25 is also connected to an output terminal 61.

An input terminal 62 is connected to an input of the gate 42. An output of the gate 42 is connected to a clock terminal of the F/F 15. The output of the gate 42 is also connected to an input "a" of the selector 45. An input terminal 63 is connected to an input of the gate 44. An output of the gate 44 is connected to an input "b" of the selector 45. The output of the gate 44 is also connected to a clock terminal of the F/F 25. An output of the selector 45 is connected to a G terminal (control terminal) of the latch 35. An input terminal 64 is connected to each of a control terminal of the selector 12, a control terminal of the selector 45, and a control terminal of the selector 32.

An input value Din5 is supplied to the circuit block 10 through the input terminal 60. A test value Din1 is supplied to the circuit block 10 through the input terminal 65. A test value Din2 is supplied to the test circuit 30 through the input terminal 67. A test value Dout1 is output from the test circuit 30 through the output terminal 66. A test value Dout2 is output from the circuit block 20 through an output terminal 68. An output value Dout5 is output from the circuit block 20 through the output terminal 61. Note that the logical values such as the input value, the test values, and the output value may be logical values transmitted in serial or in parallel.

A clock CLK1 is supplied to the signal supply circuit 40 through the input terminal 62. A clock CLK2 is supplied to the signal supply circuit 40 through the input terminal 63. A control signal CS is supplied to the signal supply circuit 40 through the input terminal 64. Each of the clocks serves as a control signal that transits between a high level (H) and a low level (L) at intervals of a certain cycle. The control signal CS is a control signal for switching between a test mode and a normal operation mode.

As shown in FIG. 2, the operating state of the semiconductor integrated circuit 100 is determined in accordance with a signal value (logical value) of the control signal CS. Specifically, as shown in FIG. 2, when CS=00 or CS=01, the semiconductor integrated circuit 100 is set to the normal operation mode. Meanwhile, when CS=10, the semiconductor integrated circuit 100 is set to the test mode, and the circuit block 10 is set as a scan target. When CS=11, the semiconductor integrated circuit 100 is set to the test mode, and the circuit block 20 is set as a scan target. Note that the term "scan" indicates that a test value (logical value) is allowed to pass through a target circuit block. The target circuit block is scanned and an output value (logical value) from the circuit block is compared with an expected value (logical value), thereby making it possible to conduct a delay test for the circuit block.

Referring to FIG. 3, the operating state of the semiconductor integrated circuit 100 during the test will be described.

As shown in FIG. 3, when CS=10, the scan target is the circuit block 10. Specifically, when CS=10, the selector 12, the selector 32, and the selector 45 are controlled in the following manner. The selector 12 selectively outputs the input value (logical value) received at the input "a". The selector 32 selectively outputs the input value received at the input "b". The selector 45 selectively outputs the clock CLK1 received at the input "a". The test circuit 30 is supplied with the clock CLK1 through the selector 45. The test value Din1 is supplied to the selector 12 through the input terminal 65. The test value Dout1 to be compared with the expected value is output to the tester from the latch 35 through the output terminal 66.

As shown in FIG. 3, when CS=11, the scan target is the circuit block 20. Specifically, when CS=11, the selector 12, the selector 32, and the selector 45 are controlled in the following manner. The selector 12 is set to an undefined state. The selector 32 selectively outputs the test value received at the input "a". The selector 45 selectively outputs the clock CLK2 received at the input "b". Note that the test circuit 30 is supplied with the clock CLK2 through the selector 45. The test value Din2 is supplied to the selector 32 through the input terminal 67. The test value Dout2 to be compared with the expected value is output to the tester from the F/F 25 through the output terminal 68.

Note that when the semiconductor integrated circuit 100 is in the normal operation mode, the selector 12, the selector 32, and the selector 45 are controlled by the control signal CS in the following manner. The selector 12 selectively outputs the input value Din5 received at the input "b". The selector 32 selectively outputs the input value received at the input "b". The selector 45 is set to a stop state. Specifically, the output of the selector 45 is set to the low level (L). When the output of the selector 45 is at the low level, the latch 35 is in a through state, i.e., a state of holding no input value.

In this exemplary embodiment, as described above, the test circuit 30 is connected between the circuit block 10 and the circuit block 20. The test circuit 30 outputs the output value of the circuit block 10, which is set as the scan target, to the tester in a mode without passing through the circuit block 20. The test circuit 30 transmits the input value, which is received without being passed through the circuit block 10, to the circuit block 20 set as the scan target.

The employment of this configuration makes it possible to conduct the delay tests for the circuit blocks 10 and 20 independently by using clocks of actual operating frequencies. This makes it possible to effectively avoid the occurrence of inconveniences caused by setting the test clock to the high frequency clock or the low frequency clock as in the conventional case (for example, the level of the delay test cannot be increased, and there arises a need to design the circuit block, which operates based on the low frequency clock, so as to be able to operate based also on the high frequency clock).

Further, in this exemplary embodiment, the test circuit 30 is provided with the selector 32. This enables the above configuration to be realized easily.

Furthermore, in this exemplary embodiment, the test circuit 30 is provided with the latch 35. During the normal operation of the semiconductor integrated circuit 100, the latch 35 is set to the through state. During the delay test for the semiconductor integrated circuit 100, the latch 35 is supplied with the clock CLK1 or CLK2.

In general, delay tests are conducted on condition that the circuit configuration in which a single net under delay test is sandwiched between a F/F and a latch is employed, for convenience of a circuit development tool (in short, DFT (Design-For-test) tool). By the employment of the circuit configuration in which the net 18 is sandwiched between the F/F 15 and the latch 35 as in this exemplary embodiment, a high level of compatibility with the circuit development tool can be secured. This is particularly beneficial when the size of the semiconductor integrated circuit 100 is large. The above description can also be applied to the configuration in which the net 28 is sandwiched between the latch 35 and the F/F 25.

As described above, during the normal operation of the semiconductor integrated circuit 100, the latch 35 is set to the through state. Accordingly, the provision of the latch 35 effectively suppresses any adverse effect on the normal operation of the semiconductor integrated circuit 100.

Referring now to FIG. 4, the case of scanning the circuit block 10 will be described. Note that in this case, the control signal CS is set as CS=10 in advance.

First, at the rising edge of the CLK1 immediately after a time t1, the test value Din1 is input to the circuit block 10 through the input terminal 65.

At the rising edge of the CLK1 immediately after a time t2, the F/F 15 receives the test value Din1 and outputs the received value to the net 18. The net 18 outputs a logical value according to the input of the test value Din1 without any unduly large delay.

At the rising edge of the CLK1 immediately after a time t3, the latch 35 receives the output value of the net 18 and outputs the received value to the output terminal 66. In this manner, the test value Dout1 is output from the test circuit 30 to the output terminal 66.

In this exemplary embodiment, as described above, the test circuit 30 receives the output value from the circuit block 10 and the test value from the outside. Then, when the circuit block 10 is set as the test target, the test circuit 30 selects the output value between the output value and the test value.

Furthermore, in this exemplary embodiment, as described above, when the circuit block 10 is set as the test target, the test circuit 30 outputs the selected output value to the outside based on a first clock.

Referring to FIG. 5, the case of scanning the circuit block 20 will be described. Note that in this case, the control signal CS is set as CS=11 in advance.

First, at the rising edge of the CLK2 immediately after the time t1, the test value Din2 is input to the test circuit 30 through the input terminal 67.

At the rising edge of the CLK2 immediately after the time t2, the latch 35 receives the test value Din2 and outputs the received value to the net 28. The net 28 outputs a logical value according to the input of the test value Din2 without any unduly large delay.

At the rising edge of the CLK2 immediately after the time t3, the F/F 25 receives the output value of the net 28 and outputs the received value to the output terminal 68. In this manner, the test value Dout2 is output from the circuit block 20 through the output terminal 68.

In this exemplary embodiment, as described above, the test circuit 30 receives the output value from the circuit block 10 and the test value from the outside. Then, when the circuit block 20 is set as the test target, the test circuit 30 selects the test value between the output value and the test value.

Further, in this exemplary embodiment, as described above, when the circuit block 20 is set as the test target, the test circuit 30 outputs the selected test value to the outside based on a second clock.

Referring to FIG. 6, a description is given of the case where a large delay occurs in the net 28 at the time of scanning the circuit block 20.

First, at the rising edge of the CLK2 immediately after the time t1, the test value Din2 is input to the test circuit 30 through the input terminal 67.

At the rising edge of the CLK2 immediately after the time t2, the latch 35 receives the test value Din2 and outputs the received value to the net 28. Unlike the case shown in FIG. 5, however, the net 28 outputs a logical value according to the input of the test value Din2 with a large delay as schematically shown in FIG. 6.

At the rising edge of the CLK2 immediately after the time t3, the F/F 25 receives the output value of the net 28 and outputs the received value to the output terminal 68. The F/F 25 receives the output value obtained when a processing delay occurs in the net 28. Accordingly, as schematically shown in FIG. 6, an undefined output value is output as the test value Dout2. The tester compares the undefined output value with the expected value, thereby detecting a delay in the net 28.

REFERENCE EXAMPLE

Figure 7:
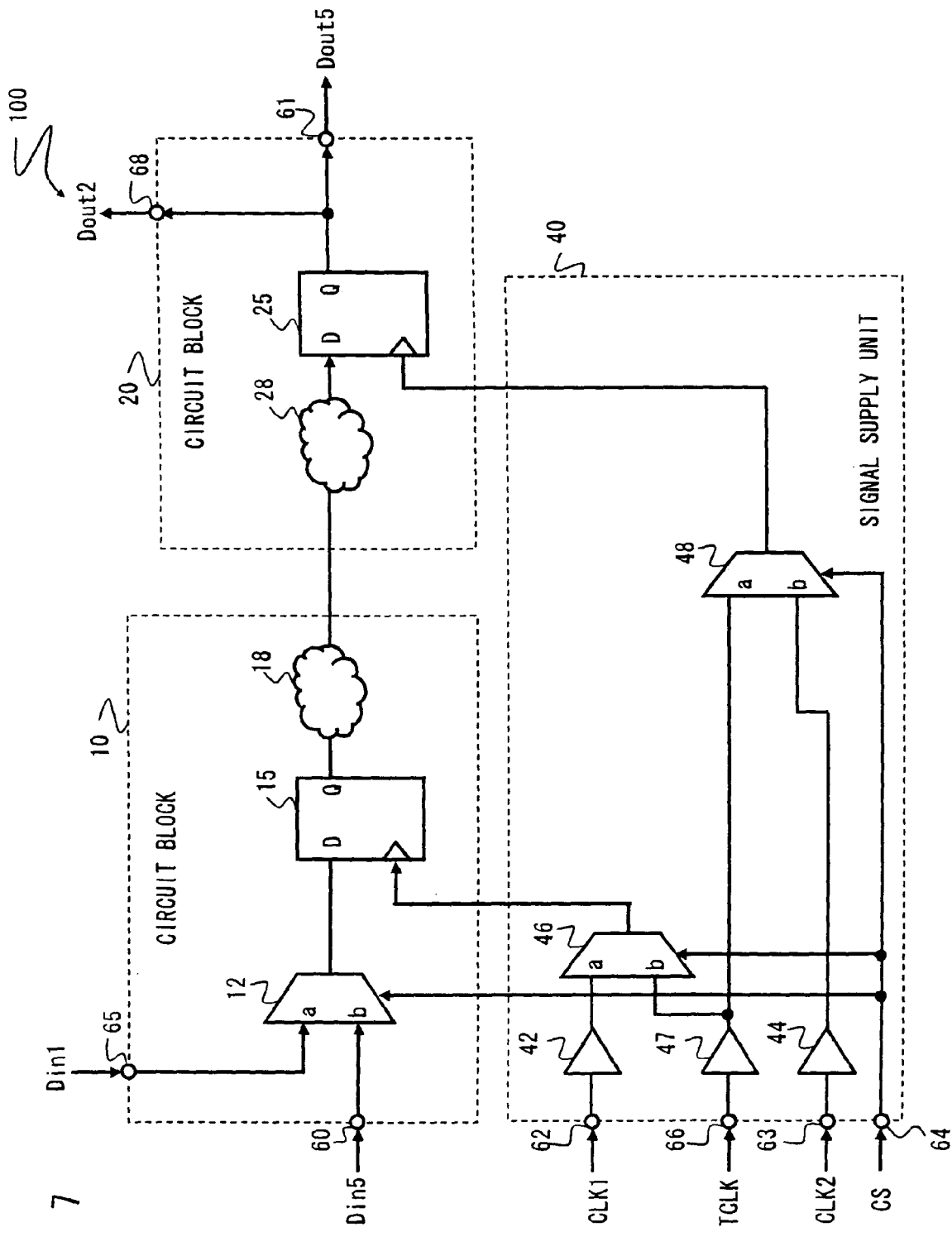
FIG. 7 is a schematic circuit diagram of a semiconductor integrated circuit according to a reference example.

Referring to FIG. 7, a description is given of a semiconductor integrated circuit according to a reference example.

In the semiconductor integrated circuit 100 shown in FIG. 7, operating states of a selector 46 and a selector 48 are determined according to the control signal CS.

During the normal operation, the selector 46 selectively supplies the clock CLK1 to the clock terminal of the F/F 15. During the test operation, the selector 46 selectively supplies a test clock TCLK to the clock terminal of the F/F 15. During the normal operation, the selector 48 selectively supplies the clock CLK2 to the clock terminal of the F/F 25. During the test operation, the selector 48 selectively supplies the test clock TCLK to the clock terminal of the F/F 25.

It is assumed herein that the clock CLK1 has a frequency lower than that of the clock CLK2. In this case, when the test clock TCLK is set to the clock CLK1, a delay of the circuit block 20 in the actual operating state cannot be detected. On the other hand, when the test clock TCLK is set to the clock CLK2, it is necessary to provide an additional circuit (drive circuit or the like) to the circuit block 10 in order to secure the normal operation during the test. According to an exemplary embodiment of the present invention, it is possible to effectively avoid the occurrence of such inconveniences.

Second Exemplary Embodiment

Figure 8:
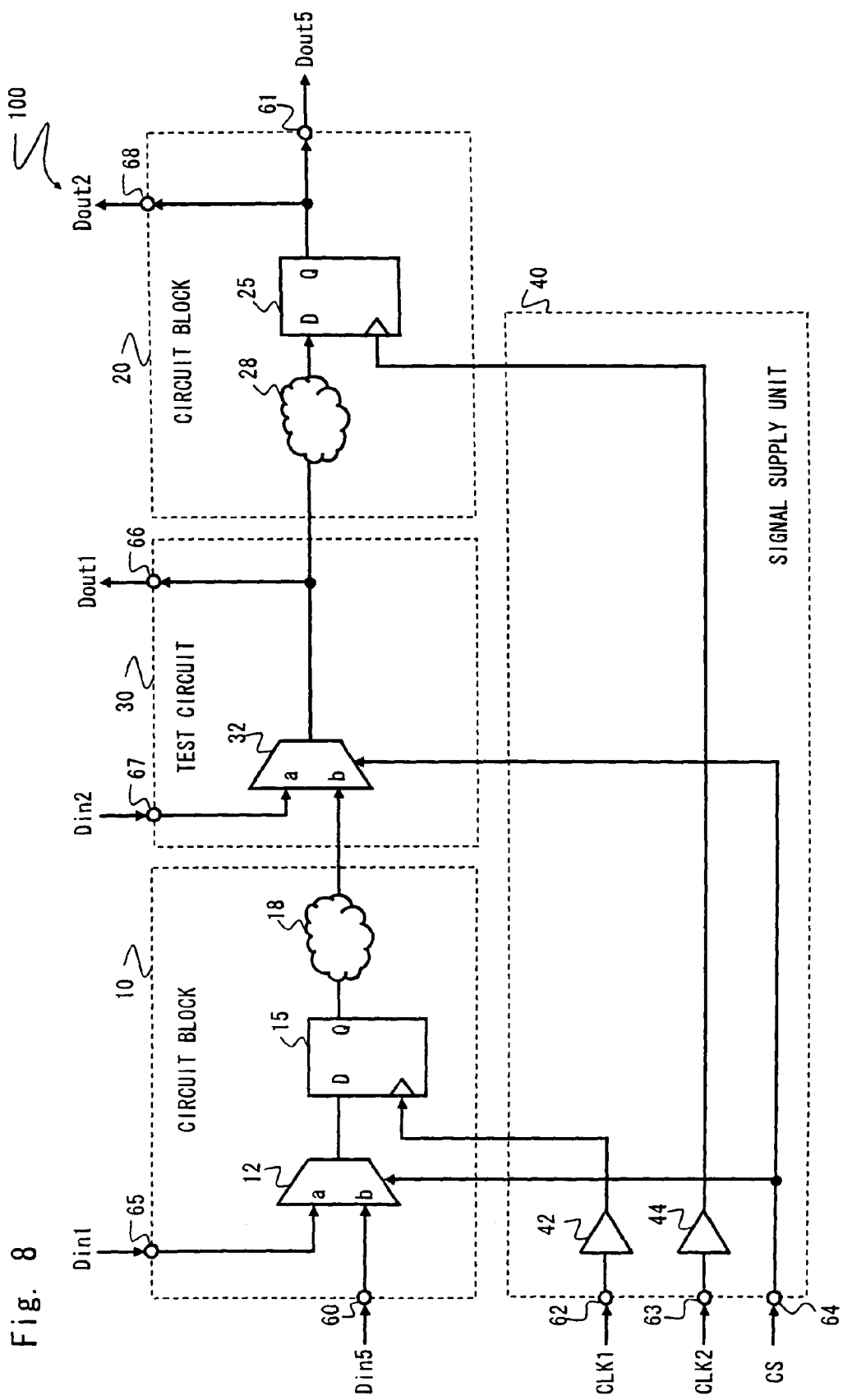
FIG. 8 is a schematic circuit diagram of a semiconductor integrated circuit according to a second exemplary embodiment of the present invention.
Figure 9:
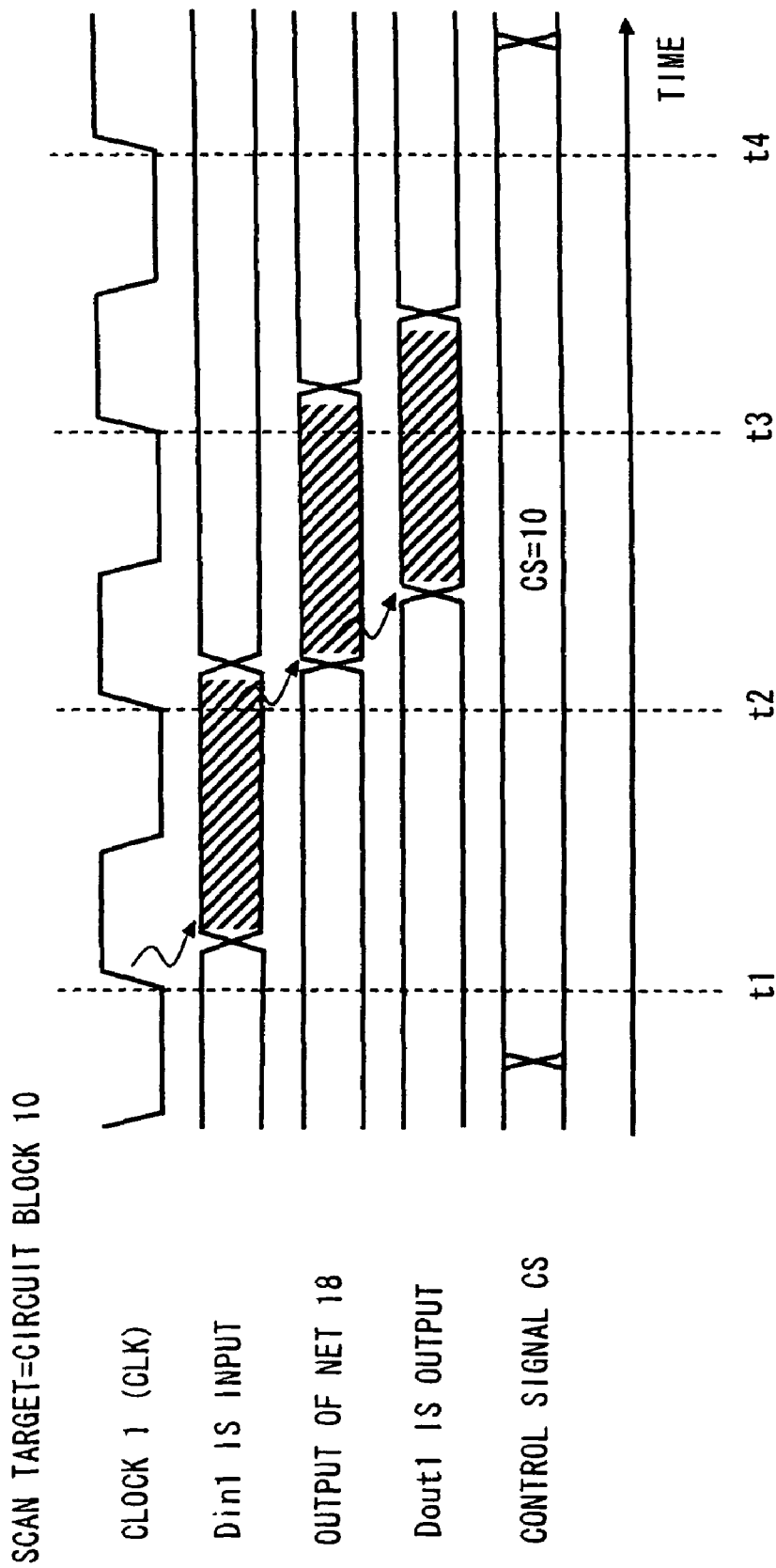
FIG. 9 is a schematic timing diagram illustrating the operation of the semiconductor integrated circuit at the time of scanning according to the second exemplary embodiment of the present invention.
Figure 10:
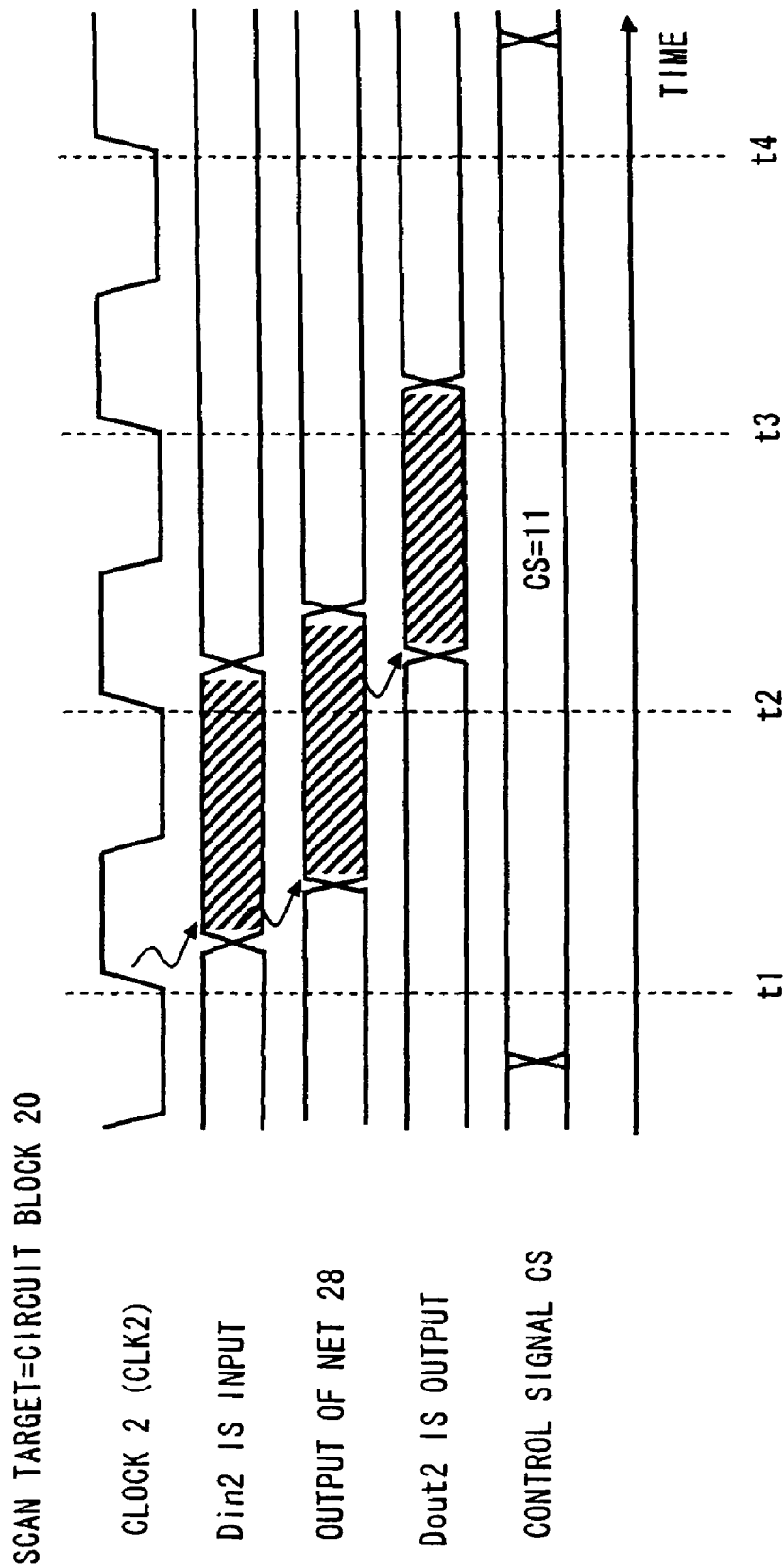
FIG. 10 is a schematic timing diagram illustrating the operation of the semiconductor integrated circuit at the time of scanning according to the second exemplary embodiment of the present invention.
Figure 11:
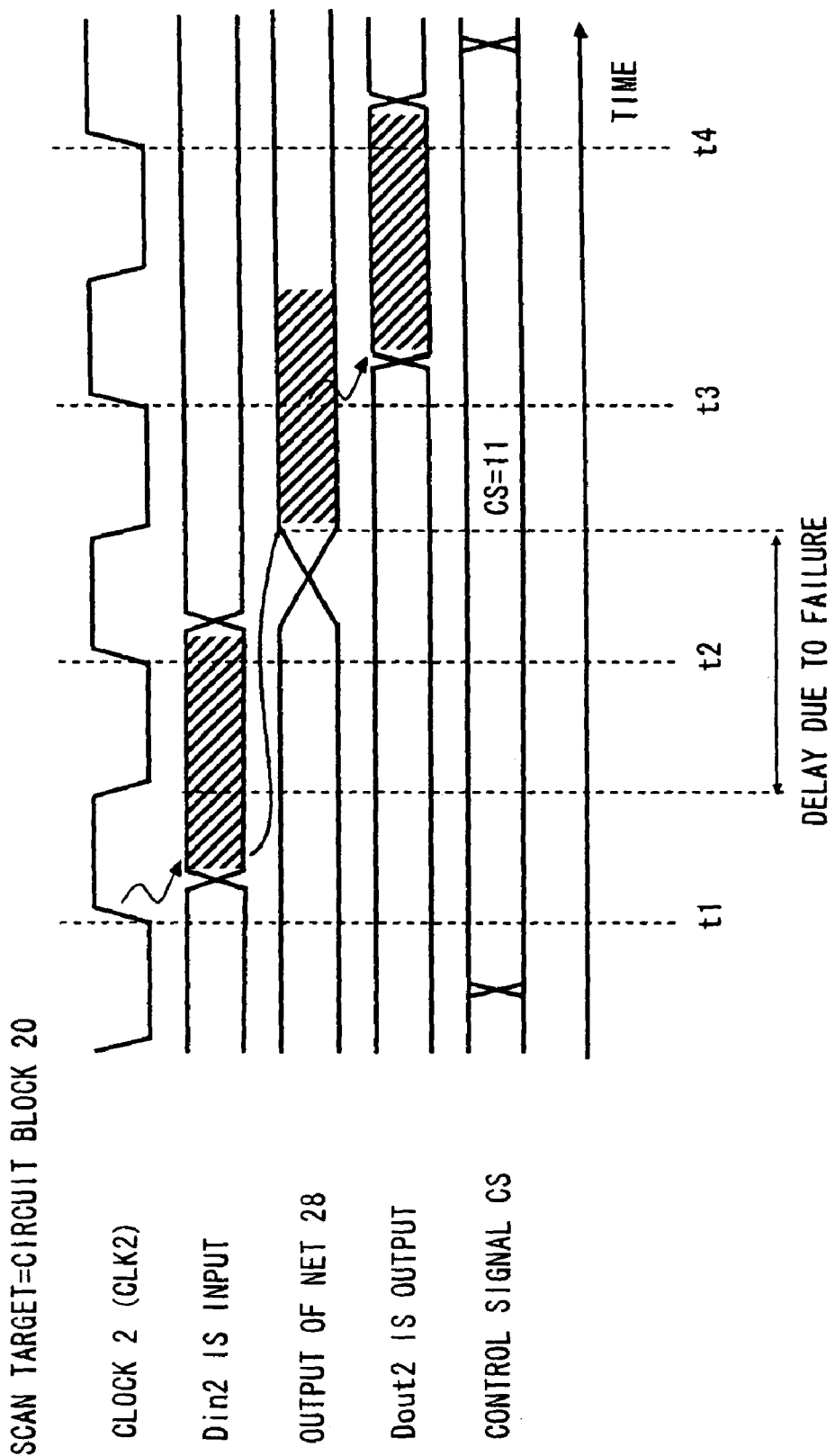
FIG. 11 is a schematic timing diagram illustrating the operation of the semiconductor integrated circuit at the time of scanning according to the second exemplary embodiment of the present invention.

Referring to FIGS. 8 to 11, a second exemplary embodiment of the present invention will be described. FIG. 8 is a schematic circuit diagram of a semiconductor integrated circuit according to the second exemplary embodiment. FIGS. 9 to 11 are schematic timing diagrams each illustrating the operation of the semiconductor integrated circuit at the time of scanning.

As shown in FIG. 8, unlike the first exemplary embodiment, the test circuit 30 according to this exemplary embodiment does not include the latch 35, and the signal supply circuit 40 does not include the selector 45. Also in this case, as in the first exemplary embodiment, it is possible to conduct the delay tests for the circuit blocks 10 and 20 independently by using clocks of actual operating frequencies. This makes it possible to effectively avoid the occurrence of inconveniences caused by setting the test clock to the high frequency clock or the low frequency clock as in the conventional case.

According to this exemplary embodiment, effects similar to those of the first exemplary embodiment can be obtained with a circuit size smaller than that of the first exemplary embodiment. Further, as described later, delay tests can be conducted in less time. In this regard, however, the compatibility with a general-purpose circuit development tool may be reduced compared to the first exemplary embodiment.

As shown in FIG. 8, the output of the gate 42 is connected to the clock terminal of the F/F 15. The output of the gate 44 is connected to the clock terminal of the F/F 25. The output of the selector 32 is connected to the input of the net 28. The output of the selector 32 is also connected to the output terminal 66.

Referring to FIG. 9, the case of scanning the circuit block 10 will be described. Note that in this case, the control signal CS is set as CS=10 in advance.

First, at the rising edge of the CLK1 immediately after the time t1, the test value Din1 is input to the circuit block 10 through the input terminal 65.

At the rising edge of the CLK1 immediately after the time t2, the F/F 15 receives the test value Din1 and outputs the received value to the net 18. The net 18 outputs a logical value according to the input of the test value Din1 without any unduly large delay. The output value of the net 18 is supplied to the output terminal 66 through the selector 32 without any unduly large delay. In this manner, the test value Dout1 is output to the tester from the test circuit 30 through the output terminal 66.

Referring to FIG. 10, the case of scanning the circuit block 20 will be described. Note that in this case, the control signal CS is set as CS=11 in advance.

First, at the rising edge of the CLK2 immediately after the time t1, the test value Din2 is input to the test circuit 30 through the input terminal 67. The net 28 outputs a logical value according to the input of the test value Din2 without any unduly large delay.

At the rising edge of the CLK2 immediately after the time t2, the F/F 25 receives the output value of the net 28 and outputs the received value to the output terminal 68. In this manner, the test value Dout2 is output to the tester from the circuit block 20 through the output terminal 68.

Referring to FIG. 11, a description is given of the case where a large delay occurs in the net 28 at the time of scanning the circuit block 20.

First, at the rising edge of the CLK2 immediately after the time t1, the test value Din2 is input to the test circuit 30 through the input terminal 67. The net 28 outputs a logical value according to the input of the test value Din2 with a large delay as schematically shown in FIG. 11.

At the rising edge of the CLK2 immediately after the time t2, the F/F 25 receives the output value of the net 28 and outputs the received value to the output terminal 68. The tester compares the test value Dout2, which is output through the output terminal 68, with the expected value, thereby detecting a delay fault of the net 28. Also in this case, a normal logical value is output from the net 28 with a delay. In other words, illustrated is the case where the logic test for the semiconductor integrated circuit 100 is successful, but the delay test is unsuccessful.

Note that the present invention is not limited to the above exemplary embodiments, and can be modified as appropriate without departing from the scope of the present invention.

The functions of the semiconductor integrated circuit are not restricted. The usage of the semiconductor integrated circuit is not restricted. Any number of circuit blocks may be incorporated into the semiconductor integrated circuit. The difference in frequency between the clock CLK1 and the clock CLK2 is not restricted. The specific configuration of each circuit block is not restricted. The specific configuration of the test circuit is not restricted. The specific configuration of each net is not restricted. The specific configuration of each selector is not restricted. The specific configuration of the signal supply unit is not restricted. The logical values input/output to/from the circuit blocks and the test circuit may be transmitted in serial or in parallel.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit comprising:
   a first logic circuit that operates based on a first clock;
   a second logic circuit that operates based on a second clock having a frequency different from a frequency of the first clock; and
   a test circuit connected between the first logic circuit and the second logic circuit,
   wherein the test circuit outputs an output of the first logic circuit set as a test target, in a mode without passing through the second logic circuit, and transmits an input value received without being passed through the first logic circuit, to the second logic circuit set as a test target.

2. The semiconductor integrated circuit according to claim 1, wherein the test circuit comprises a first selection circuit that receives an output value of the first logic circuit and the input value.

3. The semiconductor integrated circuit according to claim 2, wherein
   the test circuit further comprises a first holding circuit that holds an output value of the first selection circuit, and
   the first holding circuit operates synchronously with one of the first clock and the second clock respectively supplied to the first logic circuit and the second logic circuit, the first logic circuit and the second logic circuit being set as the test target.

4. The semiconductor integrated circuit according to claim 3, wherein the first holding circuit transmits, during a normal operation, the output value of the first selection circuit to the second logic circuit without holding the output value of the first selection circuit.

5. The semiconductor integrated circuit according to claim 3, wherein
   the first logic circuit comprises:
   a second holding circuit that operates synchronously with the first clock; and
   a first combinational circuit connected between the second holding circuit and the first holding circuit.

6. The semiconductor integrated circuit according to claim 3, wherein the second logic circuit comprises:
   a third holding circuit that operates synchronously with the second clock; and
   a second combinational circuit connected between the first holding circuit and the third holding circuit.

7. The semiconductor integrated circuit according to claim 6, wherein the output value of the first logic circuit is output via a node between the first selection circuit and the second combinational circuit, without being passed through the second logic circuit.

8. The semiconductor integrated circuit according to claim 1, wherein the first logic circuit comprises a second selection circuit that receives a value input during a normal operation and a value input during a test.

9. The semiconductor integrated circuit according to claim 2, further comprising a signal supply circuit that supplies to the test circuit a signal for determining an operating state of at least the first selection circuit.

10. An operation method of a semiconductor integrated circuit, the semiconductor integrated circuit comprising:
    a first logic circuit that operates based on a first clock;
    a second logic circuit that operates based on a second clock having a frequency different from a frequency of the first clock; and
    a test circuit connected between the first logic circuit and the second logic circuit,
    the operation method comprising:
    outputting, by the test circuit, an output of the first logic circuit set as a test target, in a mode without passing through the second logic circuit, and transmitting an input value received without being passed through the first logic circuit, to the second logic circuit set as a test target.

11. The operation method of a semiconductor integrated circuit according to claim 10, further comprising:
    receiving, by the test circuit, an output value from the first logic circuit and a test value from an outside; and
    selecting, by the test circuit, the output value between the output value and the test value, when the first logic circuit is set as the test target.

12. The operation method of a semiconductor integrated circuit according to claim 11, further comprising:
    outputting, by the test circuit, the selected output value to the outside based on the first clock, when the first logic circuit is set as the test target.

13. The operation method of a semiconductor integrated circuit according to claim 10, further comprising:
    receiving, by the test circuit, an output value from the first logic circuit and a test value from an outside; and
    selecting, by the test circuit, the test value from the output value and the test value, when the second logic circuit is set as the test target.

14. The operation method of a semiconductor integrated circuit according to claim 13, further comprising:
    outputting, by the test circuit, the selected test value to the outside based on the second clock, when the second logic circuit is set as the test target.

* * * * *